(12) United States Patent
Long

(10) Patent No.: US 11,251,204 B2
(45) Date of Patent: Feb. 15, 2022

(54) ARRAY SUBSTRATE, METHOD FOR REPAIRING SAME, AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/610,673

(22) PCT Filed: May 16, 2019

(86) PCT No.: PCT/CN2019/087181
§ 371 (c)(1),
(2) Date: Nov. 4, 2019

(87) PCT Pub. No.: WO2020/052262
PCT Pub. Date: Mar. 19, 2020

(65) Prior Publication Data
US 2020/0303420 A1    Sep. 24, 2020

(30) Foreign Application Priority Data
Sep. 11, 2018 (CN) .......................... 201821480470.2

(51) Int. Cl.
*H01L 27/12* (2006.01)
(52) U.S. Cl.
CPC ........ *H01L 27/124* (2013.01); *H01L 27/1259* (2013.01)
(58) Field of Classification Search
CPC .......................... H01L 27/124; H01L 27/1259
See application file for complete search history.

(56) References Cited

U.S. PATENT DOCUMENTS 7,535,521 B2    5/2009  Kim et al.
2009/0284679 A1*  11/2009  Kim ...................... G02F 1/1345
                                                           349/54
(Continued)

FOREIGN PATENT DOCUMENTS

CN    101644838 A  *  2/2010
CN    102981331 A     3/2013
(Continued)

OTHER PUBLICATIONS

International Search Report of PCT/CN2019/087181, dated Aug. 7, 2019, 16 pages.

*Primary Examiner* — Michele Fan
(74) *Attorney, Agent, or Firm* — Muncy, Geissler, Olds & Lowe, P.C.

(57) ABSTRACT

An array substrate includes: a base substrate; one or more first signal lines provided on the base substrate; a plurality of repair line sets also provided on the base substrate and configured to repair the first signal lines, each of the repair line sets comprising one or more repair lines which intersect with and are insulated from at least one of the first signal lines; and one or more second signal lines also provided on the base substrate, at least one of the one or more second signal lines having one end which is arranged to intersect with and be insulated from the one or more repair lines, and the other end which is connected to a driving circuit for supplying an electrical signal to the one or more first signal lines. The second signal line is different from the first signal line.

18 Claims, 2 Drawing Sheets

(56) References Cited

U.S. PATENT DOCUMENTS

2012/0319557 A1* 12/2012 Kretz .................... G02F 1/1309
                                                     313/306
2014/0063398 A1   3/2014 Chang et al.
2015/0042690 A1*  2/2015 Jin ...................... H01L 27/3262
                                                     345/690
2016/0013211 A1   1/2016 Kim et al.

FOREIGN PATENT DOCUMENTS

| CN | 103745970 A  |   | 4/2014  |
|----|--------------|---|---------|
| CN | 206758435 U  | * | 12/2017 |
| CN | 208588882 A  |   | 3/2019  |

* cited by examiner

ARRAY SUBSTRATE, METHOD FOR REPAIRING SAME, AND DISPLAY DEVICE

CROSS-REFERENCE TO RELATED APPLICATION

The present application is the U.S. national phase of PCT Application No. PCT/CN2019/087181 filed on May 16, 2019, which claims a priority of the Chinese Patent Application No. 201821480470.2 filed on Sep. 11, 2018, which are incorporated herein by reference in their entirety.

TECHNICAL FIELD

The present disclosure relates to the field of product manufacturing technology, in particular to an array substrate.

BACKGROUND

A conventional repair line structure typically includes one or two repair lines that extend across an entire panel area and intersect all data lines. Such a repair line structure can repair only two defective data lines, and has disadvantages of a small number of the repair lines, a low yield and the like.

SUMMARY

In a first aspect, embodiments of the present disclosure provide an array substrate, including a base substrate; one or more first signal lines provided on the base substrate; a plurality of repair line sets also provided on the base substrate and configured to repair the first signal lines, each of the repair line sets including one or more repair lines which intersect with and are insulated from at least one of the first signal lines; and one or more second signal lines also provided on the base substrate, at least one of the one or more second signal lines having one end which is arranged to intersect with and be insulated from the one or more repair lines, and the other end which is connected to a driving circuit for supplying an electrical signal to the one or more first signal lines, wherein the second signal line is different from the first signal line. The plurality of repair line sets is sequentially disposed on the entire base substrate in a first transverse direction of the base substrate.

According to some embodiments of the present disclosure, if the first signal line corresponding to one of the plurality of repair line sets is broken, the broken first signal line is caused to be electrically connected to the repair line contained in the repair line set corresponding to the broken first signal line at a first position, and the repair line contained in the repair line set corresponding to the broken first signal line is caused to be electrically connected to the second signal line at a second position. The first position is an intersection of the broken first signal line and the repair line contained in the repair line set corresponding to the broken first signal line, and the second position is an intersection of the second signal line and the repair line contained in the repair line set corresponding to the broken first signal line.

According to some embodiments of the present disclosure, each of the first signal lines is divided, in a direction in which the first signal line is extended, into a main body portion and a repair connecting portion that is located at one end of the first signal line. The repair connecting portion has a width substantially greater than that of the main body portion, and the repair connecting portion is disposed to intersect with the repair line.

According to some embodiments of the present disclosure, the array substrate further includes a first insulating film disposed between the repair line and the repair connecting portion.

According to some embodiments of the present disclosure, each of the repair line sets further includes a connecting line, which is disposed between the second signal line and the repair line and which has one end disposed to overlap and be insulated from one end of the second signal line, and the other end connected to the repair line.

According to some embodiments of the present disclosure, the other end of the connecting line is connected to the repair line through a via hole.

According to some embodiments of the present disclosure, the array substrate further includes a second insulating film disposed between the second signal line and the connecting line.

According to some embodiments of the present disclosure, the second signal lines of at least two of the repair line sets are a common signal line.

According to some embodiments of the present disclosure, each of the repair line sets further comprises spacers disposed in a same layer as the first signal line, and the spacers are arranged at both ends of the repair line to intersect with and be insulated from the repair line.

According to some embodiments of the present disclosure, a distance between the spacer and the repair connecting portion of the first signal line adjacent to the spacer is substantially the same as a distance between the repair connecting portions of two adjacent ones of the first signal lines.

According to some embodiments of the present disclosure, the second signal line is disposed in a peripheral region of the base substrate.

According to some embodiments of the present disclosure, the first signal line is a data line or a gate line.

According to some embodiments of the present disclosure, arranging the two lines to intersect with and be insulated from each other means that the two lines are arranged to intersect with each other at an angle and be substantially insulated from each other at their intersection.

According to some embodiments of the present disclosure, arranging the spacer and the repair line to intersect with and be insulated from each other means that an orthogonal projection of the repair line on the base substrate overlaps the spacer and that they are substantially insulated from each other at their intersection.

In a second aspect, embodiments of the present disclosure provide a display device, including the array substrate as described in the first aspect.

In a third aspect, embodiments of the present disclosure provide a method for repairing an array substrate, applied to the array substrate as described in the first aspect. The method includes: if the first signal line corresponding to one of the plurality of repair line sets is broken, causing the broken first signal line to be electrically connected to the repair line contained in the repair line set corresponding to the broken first signal line at a first position; and causing the repair line contained in the repair line set corresponding to the broken first signal line to be electrically connected to the second signal line at a second position, wherein the first position is an intersection of the broken first signal line and the repair line contained in the repair line set corresponding to the broken first signal line, and the second position is an intersection of the second signal line and the repair line contained in the repair line set corresponding to the broken first signal line.

BRIEF DESCRIPTION OF THE DRAWINGS

In order to illustrate the technical solutions in the embodiments of the present disclosure or in the related art more clearly, the drawings necessary for the description of the embodiments will be briefly described below. It is obvious that the drawings in the following description relate to only some of the embodiments of the present disclosure, and based on these drawings, those having ordinary skills in the art can obtain other drawings without any inventive effort.

DESCRIPTION OF REFERENCE NUMERALS

10: repair line set; 100: first position; 20: display area; 11: main body portion; 12: repair connection part; 1: first signal line; 2: repair line; 3: second signal line; 4: connecting line; 5: spacer; 6: common connecting line; 7: driving circuit; 8: via hole; 9: insulating film; BS: base substrate.

DETAILED DESCRIPTION

In order to make the objects, technical solutions and advantages of the embodiments of the present disclosure more apparent, the embodiments of the present disclosure will be clearly and completely described below in conjunction with the drawings of the embodiments of the present disclosure. It is apparent that the described embodiments are part, rather than all, of the embodiments of the present disclosure. Based on the described embodiments of the present disclosure, those having ordinary skills in the art can obtain the other embodiments, all of which fall within the protection scope of the present disclosure.

Figure 1:
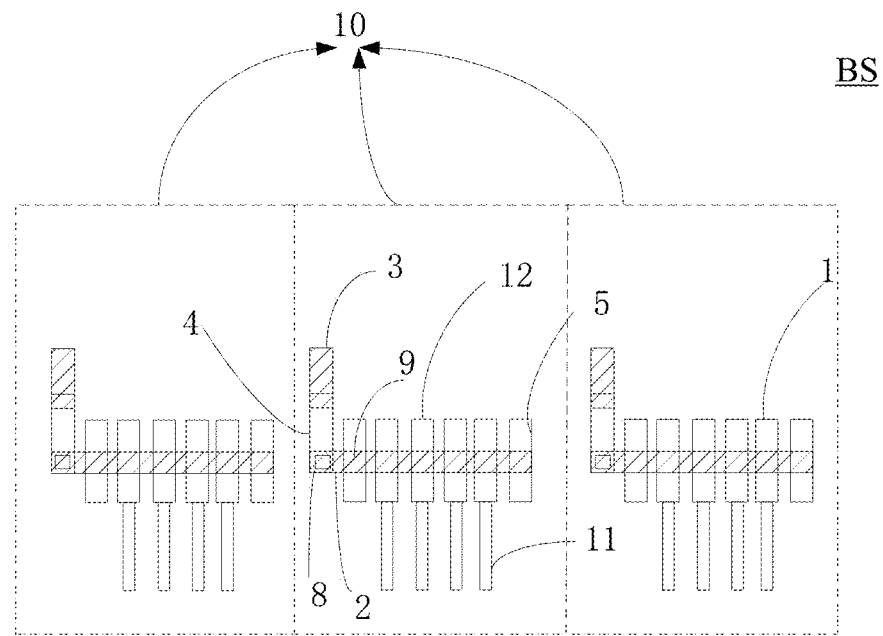
FIG. 1 is a schematic view showing a structure of a plurality of repair line sets on an array substrate in an embodiment of the present disclosure.
Figure 3:
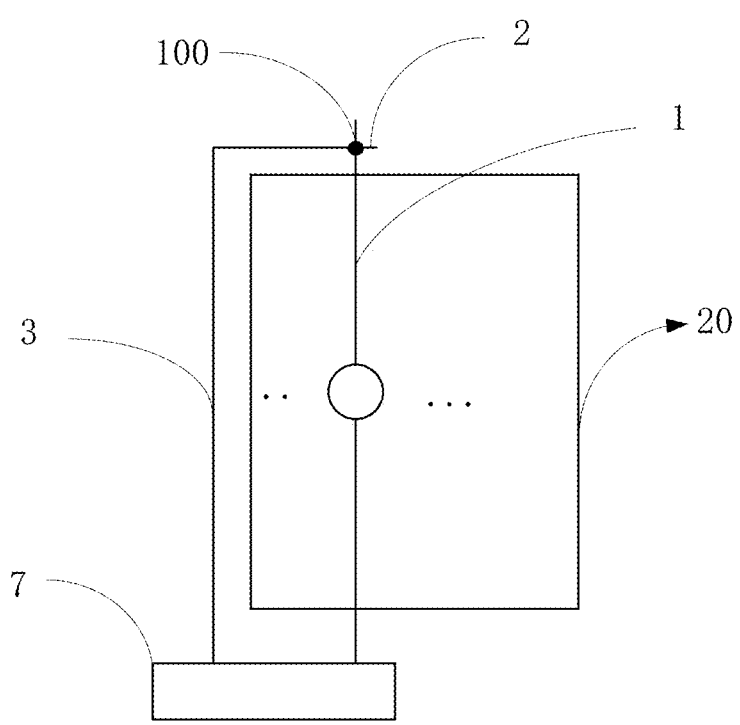
FIG. 3 is a schematic view showing an arrangement of repair lines on the array substrate in the embodiment of the present disclosure.

As shown in FIG. 1 and FIG. 3, an embodiment of the present disclosure provides an array substrate, including a base substrate BS which is provided thereon with a plurality of first signal lines 1 and also with a plurality of repair line sets 10 configured to repair the plurality of first signal lines 1. Each of the repair line sets 10 includes one or more repair lines 2 that intersect with and are insulated from at least one of the first signal lines 1.

The base substrate BS is further provided with one or more second signal line 3, which have one end intersecting with and insulated from the repair line 2, and the other end connected to a driving circuit for supplying an electrical signal to the first signal lines 1.

When the first signal line 1 in one of the repair line sets 10 breaks (an open circuit occurs), the broken first signal line 1 is caused to be electrically connected to the repair line 2 at an intersection of the broken first signal line 1 and the repair line 2 (a first position 100), and the repair line 2 is caused to be electrically connected to the second signal line 3 at an intersection of the second signal line 3 and the repair line (a second position). The array substrate of this embodiment includes the plurality of repair line sets 10, each of which can repair at least one defective first signal line 1. Accordingly, the arrangement of the plurality of repair line sets 10 can be used to repair multiple defects, thereby greatly increasing the yield.

In this embodiment, the plurality of repair line sets 10 is sequentially arranged side by side (in a parallel manner) according to the arrangement of the plurality of first signal lines 1, but is not limited thereto.

The number of the repair line sets 10 is at least two, and FIG. 1 shows only three repair line sets 10. It should be noted that the number of the repair line sets 10 on the array substrate is not limited thereto, and can be set as actually needed. It should be further noted that the number of the repair lines 2 in each repair line set 10 is not defined here, and the number of the first signal lines 1 in each repair line set 10, which intersect with and are insulated from each of the repair lines 2, are not defined here, and both of them can be set as actually needed.

In one embodiment of the present embodiment, the base substrate BS includes three repair line sets 10, each of which includes four of the first signal lines 1. FIG. 1 is a schematic view showing a structure of one repair line set 10. In practical applications, the repair line set 10 is usually designed according to the resolution of an actual product. For example, for full high definition (FHD, 1920×1080), 96 pieces of first signal lines 1 are incorporated in one repair line set 10, and a total of 60 repair line sets 10 are achieved, but the arrangement of the repair line set is not limited thereto.

In this embodiment, as shown in FIG. 1, each of the first signal lines 1 is divided, along its extending direction, into a main body portion 11 and a repair connecting portion 12 that is located at one end of the first signal line 1. The repair connecting portion 12 has a substantially greater width than the main body portion 11, and is disposed to intersect with the repair line 2. Of course, the width of the repair connecting portion 12 may be equal to or smaller than that of the main body portion 11 according to actual needs, and the embodiment of the present disclosure is not limited thereto.

The repair connecting portion 12 is arranged such that when the broken first signal line 1 is electrically connected to the repair line 2, a connection area of the corresponding first signal line 1 and the repair line 2 is increased so as to avoid the occurrence of poor repair.

In this embodiment, an insulating film 9 is provided between the repair line 2 and the repair connecting portion 12. The provision of the insulating film 9 ensures the insulation between the repair line 2 and the first signal line 1 in a normal operating state of the first signal line 1. Correspondingly, when one of the first signal lines 1 is broken, the insulating film 9 between the corresponding first signal line 1 and the repair line 2 is etched and removed by a laser ablation process, and a metal thin film is then deposited at a resultant hole using a metal sputtering process to connect the repair line 2 and the corresponding first signal line 1 (the processes for removing the insulating film 9 and connecting the first signal line 1 with the repair line 2 are not limited to the laser ablation process and the metal sputtering process as described above).

Figure 2:
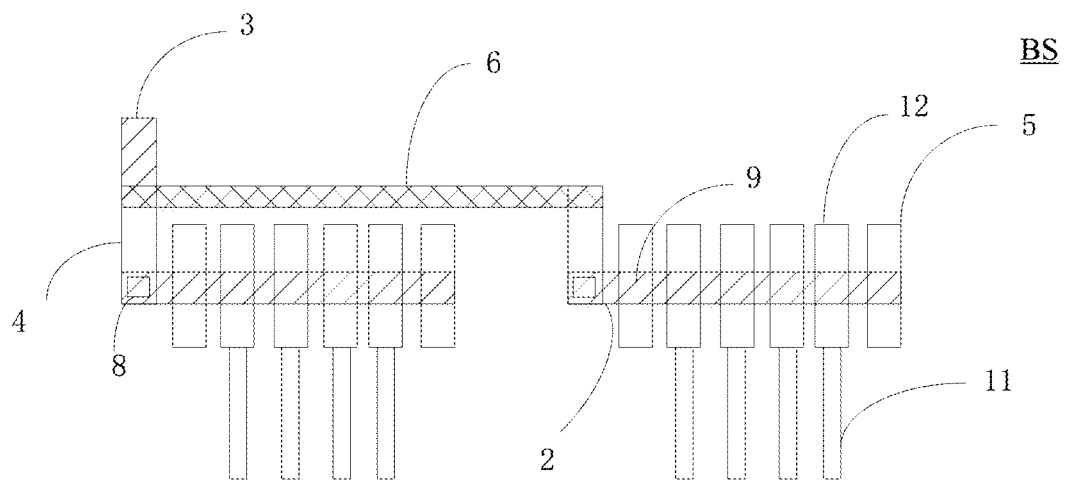
FIG. 2 is a schematic view showing a structure of two repair line sets on an array substrate in an embodiment of the present disclosure.

In this embodiment, as shown in FIG. 1 and FIG. 2, each of the repair line sets 10 further includes a connecting line 4 disposed between the second signal line 3 and the repair line 2. One end of the second signal line 3 overlaps and is insulated from one end of the connecting line 4, and the other end of the connecting line 4 is connected to the repair line 2 through a via hole 8.

In this embodiment, an insulating film 9 is provided between the second signal line 3 and the connecting line 4. The provision of the insulating film 9 ensures the insulation between the second signal line 3 and the connecting line 4 in the normal operating state of the first signal line 1. Correspondingly, when one of the first signal lines 1 needs to be repaired due to break or other defects, the insulating film 9 between the corresponding second signal line 3 and the connecting line 4 is etched and removed by a laser ablation process, and a metal thin film is then deposited using a metal sputtering process at a hole where the insulating film 9 has been removed, so as to connect the connecting line 4 with the second signal line 3 (the processes for removing the insulating film 9 and connecting the second signal line 3 with the connecting line 4 are not limited to the laser ablation process and the metal sputtering process as described above). In this embodiment, at least two repair line sets share the second signal line 3. In the case that there are many repair line sets 10, if the number of the second signal lines 3 is the same as the number of the repair line sets 10, then the cost will be increased and the wiring on the array substrate can be easily made messy and take up space. To solve this problem, at least two repair line sets 10 can be arranged to share the same second signal line 3.

There can be many connecting ways for enabling the second signal line 3 to be shared by the at least two repair line sets 10. Specifically, in an example of this embodiment, one common connecting line 6 is disposed to be connected between the connecting lines 4 of the at least two repair line sets 10, as shown in FIG. 2 which is a schematic diagram showing that two repair line sets 10 share one second signal line 3.

In this embodiment, for the purpose of ensuring the uniformity and consistency of the process, each of the repair line sets 10 further includes spacers 5 disposed in the same layer as the first signal line 1, and the spacers 5 are arranged at both ends of the repair line 2 to intersect with and be insulated from the repair line. Moreover, a distance between the spacer and the repair connecting portion of the first signal line 1 adjacent to the spacer is substantially the same as a distance between the repair connecting portions of two adjacent ones of the first signal lines 1.

If no spacers are disposed at any ends of the repair line 2, it is easy to narrow widths of the repair connecting portions 12 of the first signal lines 1 located at both ends of the repair line 2 when fabricating the first signal lines 1. However, the provision of the spacers 5 ensures the uniformity and consistency of the process and thus the consistency of the widths of the repair connecting portions 12 of the plurality of first signal lines 1.

It should be noted that, the spacer 5 is independently suspended without being electrically connected to any signal lines or external circuits on the array substrate in this embodiment.

The spacer 5 may have various specific shapes, and its width along an extending direction of the repair line 2 may also be set according to actual needs. As shown in FIG. 1 and FIG. 2 of the present embodiment, the structure and shape of the spacer 5 are the same as those of the repair connecting portion 12 of the first signal line 1 of each of the repair line sets 10, and a length of the spacer 5 in an extending direction of the first signal line 1 (a first direction) is the same as that of the repair connecting portion 12 of the first signal line 1 in the first direction, and a width of the spacer 5 in a direction perpendicular to the extending direction of the first signal line 1 (a second direction) is the same as that of the repair connecting portion 12 of the first signal line 1 in the second direction (as shown in FIG. 1 and FIG. 2, the repair connecting portion 12 of the first signal line 1 has a rectangular shape, and the spacer 5 has exactly the same rectangular shape as the repair connecting portion 12 of the first signal line 1), but the structure and shape of the spacer are not limited thereto.

In this embodiment, the second signal line 3 is disposed in a peripheral region of the base substrate BS so as not to affect the normal display of the display product.

Specifically, in an embodiment of the present disclosure, as shown in FIG. 1 and FIG. 3, the array substrate includes a base substrate BS, which is provided thereon with a plurality of first signal lines 1 and also with a plurality of repair line sets 10 configured to repair the plurality of first signal lines 1.

Each of the repair line sets 10 includes:
  a repair line 2, arranged to intersect with and be insulated from four of the first signal lines 1, the first signal line 1 including a main body portion 11, and a repair connecting portion 12 which intersects with and is insulated from the repair line 2 and which has a width (a width in a direction perpendicular to an extending direction of the first signal line 1) greater than a width of the main body portion 11 (a width in a direction perpendicular to the extending direction of the first signal line 1);
  a second signal line 3, which has one end intersecting with and insulated from the repair line 2, and the other end connected to a driving circuit 7 for supplying an electrical signal to the first signal lines 1;
  a connecting line 4, which has one end intersecting with and insulated from the second signal line 3, and the other end connected to the repairing line 2 through a via hole 8; and
  spacers 5 disposed at both ends of the repair line 2 and having a same shape as the repair connecting portions 12 of the first signal lines 1.

FIG. 3 is a schematic diagram showing only the connection of the repair line 2 and the second signal line 3 in one repair line set 10 when repairing one of the first signal lines 1 in a display area 20 (the connecting line 4 between the second signal line 3 and the repair line 2 is not shown in FIG. 3). When a break point, which is indicated by a circle on the first signal line 1 in FIG. 3, occurs in the first signal line 1, the repair line 2 is electrically connected to the first signal line 1 at a first position 100 (where they intersect with each other), and the second signal line 3 is electrically connected to the repair line 2 (where the second signal line 3 is not electrically connected to the repair line 2 in the normal operating state of the first signal line 1). In this way, a region of the break point of the first signal line 1 is replaced by the second signal line 3 and the repair line 2, and the driving circuit 7 can transmit a signal to the first signal line 1 through the second signal line 3 and the repair line 2. As a result, the display of the entire display area 20 is not affected except for the region of the break point on the first signal line 1.

Specifically, in another embodiment of the embodiment, as shown in FIG. 2 and FIG. 3, the array substrate includes a base substrate BS, which is provided thereon with a plurality of first signal lines 1 and also with a plurality of repair line sets 10 configured to repair the plurality of first signal lines 1.

Each of the repair line sets 10 includes:
  a repair line 2, arranged to intersect with and be insulated from four of the first signal lines 1, the first signal line 1 including a main body portion 11, and a repair connecting portion 12 which intersects with and is insulated from the repair line 2 and which has a width (a width in a direction perpendicular to an extending direction of the first signal line 1) greater than a width of the main body portion 11 (a width in a direction perpendicular to the extending direction of the first signal line 1);

a second signal line 3, which has one end intersecting with and insulated from the repair line 2, and the other end connected to a driving circuit 7 for supplying an electrical signal to the first signal lines 1;

a connecting line 4, which has one end intersecting with and insulated from the second signal line 3, and the other end connected to the repairing line 2 through a via hole 8; and spacers 5 disposed at both ends of the repair line 2 and having a same shape as the repair connecting portions 12 of the first signal lines 1; and the second signal lines of at least two of the repair line sets 10 are the same signal line, and the repair line 2 of each of the at least two repair line sets 10 intersects with and is insulated from the second signal line 3 through a common connecting line 6.

FIG. 2 is a schematic diagram showing only two repair line sets 10 sharing one second signal line 3, but the present disclosure is not limited thereto, and the number of the repair line sets sharing the one second signal line may be set based on actual needs. FIG. 3 is a schematic diagram showing only the connection of the repair line 2 and the second signal line 3 in one repair line set 10 when repairing one of the first signal lines 1 in a display area 20 (the connecting line between the second signal line and the repair line is not shown in FIG. 3). When a break point, which is indicated by a circle on the first signal line 1 in FIG. 3, occurs in the first signal line 1, the repair line 2 is electrically connected to the first signal line 1 at a first position 100 (where they intersect with each other), and the second signal line 3 is electrically connected to the repair line 2 (where the second signal line 3 is not electrically connected to the repair line 2 in the normal operating state of the first signal line 1). In this way, a region of the break point of the first signal line 1 is replaced by the second signal line 3 and the repair line 2, and the driving circuit 7 can transmit a signal to the first signal line 1 through the second signal line 3 and the repair line 2. As a result, the display of the entire display area 20 is not affected except for the region of the break point on the first signal line 1.

In this embodiment, the first signal line 1 is, for example, a data line or a gate line.

In general, in a normal operating state, a data line is connected to a corresponding source driving circuit, and the source driving circuit transmits a data signal to the data line connected thereto. When the first signal line 1 is a data line and the data line fails (a defect such as a break occurs), the data line needs to be repaired.

In order to repair the failed data line, it is necessary to etch and remove the insulating film 9 between the corresponding second signal line 3 and the connecting line 4 by using a laser ablation process, and to etch and remove the insulating film 9 between the failed data line and the corresponding repair line 2 by using the laser ablation process, for example. And then, it is further necessary to deposit a metal thin film by using a metal sputtering process at a hole where the insulating film 9 has been removed, so as to connect the failed data line with the corresponding repair line 2, and then to deposit a metal thin film by using the metal sputtering process, for example, at a hole where the insulating film 9 has been removed, so as to connect the connecting line 4 with the second signal line 3. In this way, the source driving circuit can supply a data signal to the failed data line through the corresponding second signal line 3 and the repair line 2, and the normal display will not be affected.

In general, in a normal operating state, a gate line is connected to a corresponding gate driving circuit, and the gate driving circuit transmits a gate driving signal to the gate line connected thereto. When the first signal line 1 is a gate line and the gate line fails (a defect such as a break occurs), the gate line needs to be repaired.

In order to repair the failed gate line, it is necessary to etch and remove the insulating film 9 between the corresponding second signal line 3 and the connecting line 4 by using a laser ablation process, and to etch and remove the insulating film 9 between the failed gate line and the corresponding repair line 2 by using the laser ablation process, for example. And then, it is further necessary to deposit a metal thin film by using a metal sputtering process at a hole where the insulating film 9 has been removed, so as to connect the failed gate line with the corresponding repair line 2, and then to deposit a metal thin film by using the metal sputtering process at a hole where the insulating film 9 has been removed, so as to connect the connecting line 4 and the second signal line 3. In this way, the gate driving circuit can supply a data signal to the failed gate line through the corresponding second signal line 3 and the repair line 2, and the normal display will not be affected.

In addition, it should be noted that, in the description of the various embodiments of the present disclosure, when it is mentioned that two lines are arranged to intersect with and be insulated from each other, it should be understood by those skilled in the art that the two lines can be arranged in a same layer or different layers. Specifically, in the case of arranging two lines in the same layer, a bridge type connection can be used, and the two lines are insulated from each other at the bridge type connection. In the case of arranging two lines in different layers, the two lines may be arranged to cross orthogonally or at a certain angle, and they are substantially insulated from each other at their cross point.

In addition, it should be noted that, in the description of the various embodiments of the present disclosure, when it is mentioned that the spacer is arranged to intersect with and be insulated from the repair line, it should be understood by those skilled in the art that it means that an orthogonal projection of the repair line on the base substrate overlaps at least a portion of the spacer, or the entire spacer and they are substantially insulated from each other at their intersection.

Furthermore, embodiments of the present disclosure provide a method for repairing an array substrate, which is applied to the array substrate as described above. The method includes: if the first signal line corresponding to one of the plurality of repair line sets is broken, causing the broken first signal line to be electrically connected to the repair line contained in the repair line set corresponding to the broken first signal line at a first position; and causing the repair line contained in the repair line set corresponding to the broken first signal line to be electrically connected to the second signal line at a second position.

The first position is an intersection of the broken first signal line and the repair line contained in the repair line set corresponding to the broken first signal line, and the second position is an intersection of the second signal line and the repair line contained in the repair line set corresponding to the broken first signal line.

Accordingly, according to the above embodiments of the present disclosure, by the arrangement of the plurality of repair line sets and the corresponding repairing method, two or more defective data lines on the array substrate can be effectively and simultaneously repaired, which is advantageous for improving the yield.

In addition, embodiments of the present disclosure further provide a display device including the array substrate as described above.

Here, the display device may be any product or component having a display function, such as a liquid crystal television (TV), a liquid crystal display (LCD), a digital photo frame, a mobile phone, a tablet computer, etc. Moreover, the display device further includes a flexible circuit board, a printed circuit board, and a backplane.

The above are preferred embodiments of the present disclosure, and it should be indicated that those having ordinary skills in the art can also make several improvements and modifications without departing from the principles of the present disclosure, and such improvements and modifications should be also considered as falling within the protection scope of the present disclosure.

What is claimed is:

1. An array substrate, comprising:
a base substrate;
one or more first signal lines provided on the base substrate;
a plurality of repair line sets also provided on the base substrate and configured to repair the first signal lines, each of the repair line sets comprising one or more repair lines which intersect with and are insulated from at least one of the first signal lines; and
one or more second signal lines also provided on the base substrate, at least one of the one or more second signal lines having one end which is arranged to intersect with and be insulated from the one or more repair lines, and the other end which is connected to a driving circuit for supplying an electrical signal to the one or more first signal lines, wherein the second signal line is different from the first signal line;
wherein each of the repair line sets further comprises spacers disposed in a same layer as the first signal line, the spacers are arranged at one end of the repair line to intersect with and are insulated from the repair line, and the spacers are arranged at the proximity of the other end of the repair line, wherein the spacers intersect with and are insulated from the repair line.

2. The array substrate according to claim 1, wherein if the first signal line corresponding to one of the plurality of repair line sets is broken, the broken first signal line is electrically connected to the repair line contained in the repair line set corresponding to the broken first signal line at a first position, and the repair line contained in the repair line set corresponding to the broken first signal line is electrically connected to the second signal line at a second position;
wherein the first position is an intersection of the broken first signal line and the repair line contained in the repair line set corresponding to the broken first signal line, and the second position is an intersection of the second signal line and the repair line contained in the repair line set corresponding to the broken first signal line; and
wherein the plurality of repair line sets is sequentially disposed on the entire base substrate in an arrangement direction of the first signal lines.

3. The array substrate according to claim 1, wherein each of the first signal lines is divided, in a direction in which the first signal line is extended, into a main body portion and a repair connecting portion that is located at one end of the first signal line, wherein the repair connecting portion has a width substantially greater than that of the main body portion, and the repair connecting portion is disposed to intersect with the repair line.

4. The array substrate according to claim 3, wherein the array substrate further comprises a first insulating film disposed between the repair line and the repair connecting portion.

5. The array substrate according to claim 1, wherein each of the repair line sets further comprises a connecting line, which is disposed between the second signal line and the repair line and which has one end disposed to overlap and be insulated from one end of the second signal line, and the other end connected to the repair line.

6. The array substrate according to claim 5, wherein there is an insulating layer between the other end of the connecting line and the repair line; and
the other end of the connecting line is connected to the repair line through a via hole arranged in the insulating layer.

7. The array substrate according to claim 5, wherein the array substrate further comprises a second insulating film disposed between the second signal line and the connecting line.

8. The array substrate according to claim 1, wherein the second signal lines of at least two of the repair line sets are a common signal line.

9. The array substrate according to claim 1, wherein a distance between the spacer and the repair connecting portion of the first signal line adjacent to the spacer is substantially the same as a distance between the repair connecting portions of two adjacent ones of the first signal lines.

10. The array substrate according to claim 1, wherein the second signal line is disposed in a peripheral region of the base substrate.

11. The array substrate according to claim 1, wherein the first signal line is a data line or a gate line.

12. The array substrate according to claim 1, wherein
arranging the repair line and the first signal line to intersect with and be insulated from each other means that the repair line and the first signal line are arranged to intersect with each other at an angle and be substantially insulated from each other at their intersection; or
arranging the repair line and the second signal line to intersect with and be insulated from each other means that the repair line and the second signal line are arranged to intersect with each other at an angle and be substantially insulated from each other at their intersection.

13. The array substrate according to claim 1, wherein arranging the spacer and the repair line to intersect with and be insulated from each other means that an orthogonal projection of the repair line on the base substrate overlaps the spacer and that they are substantially insulated from each other at their intersection.

14. A display device, comprising the array substrate according to claim 1.

15. The display device according to claim 14, wherein if the first signal line corresponding to one of the plurality of repair line sets is broken, the broken first signal line is electrically connected to the repair line contained in the repair line set corresponding to the broken first signal line at a first position, and the repair line contained in the repair line set corresponding to the broken first signal line is electrically connected to the second signal line at a second position;

wherein the first position is an intersection of the broken first signal line and the repair line contained in the repair line set corresponding to the broken first signal line, and the second position is an intersection of the second signal line and the repair line contained in the repair line set corresponding to the broken first signal line; and wherein the plurality of repair line sets is sequentially disposed on the entire base substrate in an arrangement direction of the first signal lines.

16. The display device according to claim 14, wherein each of the first signal lines is divided, in a direction in which the first signal line is extended, into a main body portion and a repair connecting portion that is located at one end of the first signal line, wherein the repair connecting portion has a width substantially greater than that of the main body portion, and the repair connecting portion is disposed to intersect with the repair line.

17. The display device according to claim 16, wherein the array substrate further comprises a first insulating film disposed between the repair line and the repair connecting portion.

18. The array substrate according to claim 1, further comprising: one or more connecting lines, one or more spacers, one or more repair connecting portions, and one or more via holes;

wherein the one or more connecting lines are disposed between the second signal line and the repair line, and have one end disposed to overlap and are insulated from one end of the second signal line, and the other end connected to the repair line;

wherein the one or more spacers are disposed in a same layer as the first signal line, the spacers are arranged at one end of the repair line, and the spacers are arranged at the proximity of the other end of the repair line, wherein the spacers intersect with and are insulated from the repair line;

wherein the one or more repair connecting portions are located at one end of the first signal line, and the repair connecting portion is disposed to intersect with the repair line; and wherein there is an insulating layer between the other end of the connecting line and the repair line, and the other end of the connecting line is connected to the repair line through a via hole arranged in the insulating layer.

* * * * *